United States Patent
Schintlmeister et al.

(10) Patent No.: US 6,913,790 B2
(45) Date of Patent: Jul. 5, 2005

(54) PROCESS FOR REDUCING THE RESISTIVITY OF AN ELECTRICALLY CONDUCTIVE LAYER

(75) Inventors: Arno Schintlmeister, Reutte/Tirol (AT); Peter Wilhartitz, Reutte/Tirol (AT)

(73) Assignee: Plansee Aktiengesellschaft, Reutte/Tirol (AU)

( * ) Notice: Subject to any disclaimer, the term of this patent is extended or adjusted under 35 U.S.C. 154(b) by 144 days.

(21) Appl. No.: 10/228,887

(22) Filed: Aug. 27, 2002

(65) Prior Publication Data

US 2003/0012881 A1 Jan. 16, 2003

Related U.S. Application Data

(63) Continuation of application No. PCT/AT01/00401, filed on Dec. 21, 2001.

(30) Foreign Application Priority Data

Dec. 27, 2000 (AT) ...................................... GM949/2000

(51) Int. Cl.[7] ........................... C23C 16/06; C23C 16/40
(52) U.S. Cl. ................. 427/250; 427/255.31; 427/376.2
(58) Field of Search ............................. 427/250, 255.31, 427/376.2, 255.29, 372.2

(56) References Cited

U.S. PATENT DOCUMENTS

| 4,045,216 A | | 8/1977 | Meyer et al. |
| 4,281,048 A | * | 7/1981 | Haering et al. ........... 429/231.5 |
| 4,557,036 A | | 12/1985 | Kyuragi et al. |
| 4,806,385 A | * | 2/1989 | Timmons ..................... 148/277 |
| 4,960,493 A | * | 10/1990 | Troup .......................... 205/181 |
| 4,996,116 A | * | 2/1991 | Webster et al. ............. 428/627 |

FOREIGN PATENT DOCUMENTS

| AT | 003 814 U1 | 8/2000 |
| EP | 0 635 718 A1 | 1/1995 |
| EP | 0 806 785 A2 | 11/1997 |

OTHER PUBLICATIONS

Ohfuji, S.–I.: "Oxygen Concentration Changes In Oxygen–Doped Molybdenum Films Under High Temperature Annealing", Elsevier; No. 4, May 1984, pp. 299–307.

* cited by examiner

*Primary Examiner*—Bret Chen
(74) *Attorney, Agent, or Firm*—Laurence A. Greenberg; Werner H. Stemer; Gregory L. Mayback

(57) ABSTRACT

The resistivity of an electrically conductive layer of molybdenum or a molybdenum alloy is reduced. For that purpose, a $MoO_2$ layer is formed on the surface of the electrically conductive layer. The sheet resistivity can thereby be reduced in the order of magnitude of 10% to 15%.

9 Claims, No Drawings

PROCESS FOR REDUCING THE RESISTIVITY OF AN ELECTRICALLY CONDUCTIVE LAYER

CROSS-REFERENCE TO RELATED APPLICATION

This application is a continuation of copending International Application No. PCT/AT01/00401, filed Dec. 21, 2001, which designated the United States and was not published in English.

BACKGROUND OF THE INVENTION

1. Field of the Invention

The invention relates to a process for reducing the resistivity (i.e., specific resistance) of an electrically conductive layer of molybdenum or a molybdenum alloy.

Electrically conductive layers of molybdenum or a molybdenum alloy for electrical or electronic components are used primarily in applications where, in addition to good electrical conductivity, a good ability of the layer to withstand high temperatures is also important.

In many electrical and electronic components, in addition to the electrically conductive layers, for example in the form of interconnects, in many cases further layers for other functions are also required and are generally deposited on the interconnects at a later stage. Therefore, even the temperatures of up to 450° C. which occur during coating alone result in a high thermal load on the interconnects, so that molybdenum and molybdenum alloys are in widespread use as layer material for the interconnects.

Typical examples for the use of thin films of molybdenum and molybdenum alloys are interconnects in flat panel displays or electrically conductive layers in solar cells.

A problem in this context is that above an elevated atmospheric humidity of 60% relative humidity, molybdenum, even at room temperature, forms surface layers, which consist of compounds comprising approximately 12 atomic % of molybdenum, approximately 75 atomic % of oxygen and approximately 8 atomic % of nitrogen. These surface layers, compared to pure molybdenum, have a considerably higher restivity.

Even if the surface layers are only formed with a relatively small thickness of the order of magnitude of a few nanometers, in the case of thin films the elevated contact resistance means that the sheet resistivity is increased considerably thereby.

SUMMARY OF THE INVENTION

It is accordingly an object of the invention to provide a method for reducing the specific resistance of an electrically conductive layer which overcomes the above-mentioned disadvantages of the heretofore-known devices and methods of this general type and which provides for a method of producing an electrically conductive layer of molybdenum or a molybdenum alloy by means of which the resistivity of the layer is reduced.

With the foregoing and other objects in view there is provided, in accordance with the invention, a method of reducing the resistivity of an electrically conductive layer. The method comprises the following steps:

providing an electrically conductive layer of molybdenum or a molybdenum alloy; and forming a $MoO_2$ layer on a surface of the electrically conductive layer.

In other words, the objects of the invention are achieved in that an $MoO_2$ layer is formed on the surface of the electrically conductive layer. Owing to the surface layer which is normally present and is formed of its own accord even at room temperature when the atmospheric humidity is high enough, the electrically conductive layers of molybdenum or a molybdenum alloy have an elevated contact resistance, which comes to bear when contact is being made with the layers and which overall therefore increases the sheet resistivity of the electrically conductive layer. The formation of a defined $MoO_2$ layer on the surface of the electrically conductive layer causes a considerable reduction in the contact resistance and therefore a reduction in the sheet resistivity.

This was altogether surprising, since oxides, compared with the associated pure metals, in general always have a resistivity which is significantly higher. $MoO_2$ also has a higher resistivity than pure molybdenum.

The explanation as to why, therefore, the contact resistance falls and therefore the heat resistivity is reduced when the surface $MoO_2$ layer is formed is that $MoO_2$ has a lower resistivity than the compounds with oxygen and nitrogen contents which are normally present at the surface of the molybdenum, and these compounds are completely broken down by the targeted formation of the $MoO_2$ layer.

In addition to this positive effect on the sheet resistivity of electrically conductive layers, a $MoO_2$ layer is also an excellent diffusion barrier, which prevents the diffusion of other layer materials into the electrically conductive layer of molybdenum or a molybdenum alloy.

The layer thickness range between 5 nm and 50 nm has proven appropriate for the $MoO_2$ layer in order, on the one hand, to completely break down the undefined surface layers which are usually present and, on the other hand, in order not to allow the contact resistance to rise too much, to reduce the sheet resistivity of the electrically conductive layer further. Beyond a layer thickness of 50 nm, the higher resistivity of $MoO_2$ compared to pure molybdenum means that the sheet resistivity generally rises.

Layer thicknesses in the range between 20 nm and 30 nm have proven particularly advantageous, and consequently, in the case of electrically conductive layers of pure molybdenum with a standard layer thickness range from 50 nm to 200 nm, it is possible to reduce the sheet resistivity by the order of magnitude of 10% to 15%.

In a preferred production process, the $MoO_2$ layer is formed by the fact that first of all, in a first step, the surface zone of the electrically conductive layer is converted into a $MoO_3$ (molybdenum trioxide) layer by an oxidation treatment, and then, in a second step, this $MoO_3$ layer is converted into an $MoO_2$ (molybdenum dioxide) layer by means of a reduction treatment.

In this context, it is particularly advantageous if the oxidation treatment is carried out for 5 to 20 min at a temperature of between 250° C. and 325° C. by means of flowing, pure oxygen, and the reduction treatment is carried out for 5 to 20 min at a temperature of between 375° C. and 450° C. by means of flowing hydrogen.

In addition to the formation of the $MoO_2$ layer in accordance with this preferred process, it is also conceivable for a $MoO_2$ layer to be deposited directly by means of suitable coating processes, such as for example sputtering processes.

The invention will now be explained in more detail below with reference to specific production examples.

EXAMPLE 1

A 1 mm thick rectangular glass plate with dimensions of 350 mm×450 mm was coated on one side with a molybdenum layer with a layer thickness of 300 nm using a sputtering process. The coated plate was heated in a vacuum drying cabinet with heatable sample holders in vacuo with a residual pressure of approximately 50 mbar to a temperature of 300° C. Then, the receptacle was flooded with dry oxygen, was evacuated again after a reaction time of 20 minutes, and was cooled to room temperature over the course of 12 hours. In this way, a 25 nm thick $MoO_3$ layer was formed in the surface zone of the molybdenum layer. Then, the plate was placed into a hydrogen furnace which can be heated on all sides, was brought to a temperature of 410° C. under flowing hydrogen and, after a reaction time of 20 minutes at this temperature, was cooled again to room temperature over the course of 2 hours. This reduction treatment resulted in the $MoO_3$ layer being completely converted to a $MoO_2$ layer.

The layer compositions and layer thicknesses were investigated by way of X-ray photoelectron spectroscopy and Auger electron spectroscopy depth profiling.

EXAMPLE 2

A glass plate of the same dimensions as above was coated as described in Example 1. The further treatment of the coated plate was carried out as in Example 1, except that the oxidation temperature in the drying cabinet was 325° C.

The same investigative methods as those used in Example 1 established that a 42 nm thick $MoO_2$ layer had formed in the surface zone of the molybdenum layer.

EXAMPLE 3

For comparative tests, a glass plate of the same dimensions was coated as described in Example 1 and, after coating, was stored in air for 168 hours at 20° C. The same investigative methods as used in Example 1 established that an approx. 5 nm thick layer comprising a compound including approximately 12 atomic % of molybdenum, 75 atomic % of oxygen and approximately 8 atomic % of nitrogen had formed in the surface zone of the molybdenum layer.

For comparison purposes, the sheet resistivity of the specimens which have been treated in accordance with Examples 1 to 3 was determined using the van der Pauw four-point method.

The results are compiled in Table 1 below.

TABLE 1

| Specimen | Treatment | Surface Layer | Layer Thickness | Sheet Resistivity |
|---|---|---|---|---|
| Example 1 | According to the invention | $MoO_2$ | 25 nm | $14.3 \cdot 10^{-6}$ Ωcm |
| Example 2 | According to the invention | $MoO_2$ | 42 nm | $16 \cdot 10^{-6}$ Ωcm |
| Example 3 | Prior art | Approximately 12 atomic % Mo; 75 atomic % $O_2$; 8 atomic % $N_2$ | approx. 5 nm | $16.4 \cdot 10^{-6}$ Ωcm |

The reduction in the sheet resistivity as a result of the formation of the surface $MoO_2$ layer is clearly apparent in particular for the layer thickness of 25 nm.

We claim:

1. A method of reducing a resistivity of an electrically conductive layer, which comprises:

providing on electrically conductive layer of a material selected from the group consisting at molybdenum and molybdenum alloy; and oxidizing the conductive layer to thereby form a $MoO_2$ layer on a surface of the electrically conductive layer.

2. The method according to claim 1, which comprises forming the $MoO_2$ layer with a layer thickness of between 5 nm and 50 nm.

3. The method according to claim 1, which comprises forming the $MoO_2$ layer with a layer thickness of between 20 nm and 30 nm.

4. The method according to claim 1, wherein the oxidizing step is a two-step process comprising, in a first step, converting a surface zone of the electrically conductive layer into a $MoO_3$ layer by an oxidation treatment process, and, in a second step, converting the $MoO_3$ layer into a $MoO_2$ layer by a reduction treatment process.

5. The method according to claim 4, which comprises performing the oxidation treatment process for a period of 5 to 20 minutes at a temperature of between 250° C. and 325° C. with flowing, pure oxygen, an performing the reduction treatment process for a period of 5 to 20 min at a temperature of between 375° C. and 450° C. with flowing hydrogen.

6. A method of reducing a resistivity of an electrically conductive layer, which comprises:

providing an electrically conductive layer of a material selected from the group consisting of molybdenum and molybdenum alloy; and depositing a layer of $MoO_2$ on a surface of the electrically conductive layer with a coating process.

7. The method according to claim 6, which comprises sputtering the $MoO_2$ layer onto the surface of the electrically conductive layer.

8. The method according to claim 6, which comprises forming the $MoO_2$ layer with a layer thickness of between 5 nm and 50 nm.

9. The method according to claim 6, which comprises forming the $MoO_2$ layer with a layer thickness of between 20 nm and 30 nm.

* * * * *